Kim et al.

(12) United States Patent
Kim et al.

(10) Patent No.: US 7,538,399 B2
(45) Date of Patent: May 26, 2009

(54) THIN FILM TRANSISTOR SUBSTRATE AND MANUFACTURING METHOD THEREOF

(75) Inventors: Jeong-il Kim, Incheon (KR); Dong-hyeon Ki, Chungcheongnam-do (KR); Yun-hee Kwak, Seoul (KR); Hyeong-jun Park, Seoul (KR); Byeong-jae Ahn, Seoul (KR); Shin-tack Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 452 days.

(21) Appl. No.: 11/303,653

(22) Filed: Dec. 15, 2005

(65) Prior Publication Data

US 2006/0177770 A1 Aug. 10, 2006

(30) Foreign Application Priority Data

Dec. 15, 2004 (KR) .................. 10-2004-0106274
Jan. 11, 2005 (KR) .................. 10-2005-0002598

(51) Int. Cl.
*H01L 27/88* (2006.01)
(52) U.S. Cl. .................. 257/401; 438/30; 438/183; 438/467; 324/770; 257/E21.444
(58) Field of Classification Search .................. 438/14, 438/17, 30, 38, 467, 131, 600, 183; 349/43; 324/770; 257/401
See application file for complete search history.

(56) References Cited

U.S. PATENT DOCUMENTS 5,874,746 A * 2/1999 Holmberg et al. .............. 257/59
6,734,925 B1 * 5/2004 Lee et al. ...................... 349/40

* cited by examiner

*Primary Examiner*—W. David Coleman
(74) *Attorney, Agent, or Firm*—Haynes and Boone LLP

(57) ABSTRACT

The present invention relates to a thin film transistor (TFT) substrate and method of making such a TFT substrate. The structure of the TFT substrate helps prevent damage to signal lines in non-display areas.

20 Claims, 23 Drawing Sheets

THIN FILM TRANSISTOR SUBSTRATE AND MANUFACTURING METHOD THEREOF

CROSS-REFERENCE TO RELATED APPLICATIONS

This application claims the benefit of Korean Patent Application Nos. 2005-0002598 and 2004-0106274, filed on Jan. 11, 2005 and Dec. 15, 2004 respectively, in the Korean Intellectual Property Office, the disclosures of which are incorporated herein by reference.

BACKGROUND OF THE INVENTION

1. Field of the Invention

The present invention relates to a thin film transistor substrate and a manufacturing method thereof, and more particularly, to a thin film transistor substrate and a manufacturing method thereof decreasing a lifting of an organic layer generated around pads.

2. Description of the Related Art

Generally, a conventional liquid crystal display (LCD) often comprises a liquid crystal panel, a backlight unit, a driving part and chassis. Further, the liquid crystal panel comprises a thin film transistor (TFT) substrate having thin film transistors, a color filter substrate and a liquid crystal layer sandwiched between the TFT substrate and the color filter substrate.

A signal line, such as a gate line or a data line etc., is formed on the TFT substrate and a pixel electrode is provided over the signal line. The signal line is connected to a pad provided in non-display area in order to be connected with an outside circuit. A passivation layer is formed between the signal line and the pixel electrode for insulating. The signal line is extended from the pad and is connected to a shorting bar for an array test.

The passivation layer is commonly made of a silicon nitride (SiNx) and can be formed on the signal line through PECVD (plasma enhanced chemical vapor deposition). If the signal line is close to the pixel electrode, cross talk can occur due to the SiNx that is provided as a dielectric layer between the signal line and the pixel electrode, thereby generating a capacitance.

Capacitance is defined as $C = \in A/d$. Herein $\in$ is a specific dielectric of a dielectric layer, A is an overlap area between the signal line and the pixel electrode and d is a distance between the signal line and the pixel electrode. Capacitance should be decreased by increasing a thickness of the SiNx (the distance between the signal line and the pixel electrode) in order to prevent cross talk from the dielectric layer. However, it is often difficult to form a required thickness of the SiNx through PECVD because it takes so much time. Thus, if only the SiNx is used as the passivation layer, a space between the signal line and the pixel electrode should keep a certain distance in order to decrease the cross talk. However, this lowers the aperture ratio, i.e., the amount of the overall display area that can transmit light.

To solve this problem, an organic layer has been introduced. Because the organic layer is formed through a spin coating or a slit coating on the signal line, not through PECVD, the thickness may be increased. Thus, the pixel electrode may be formed close to the signal line or overlapped thereof, so that the aperture ratio may be increased.

Generally, such an organic layer is formed relatively thin in the non-display area to ensure good electrical contact between the pad and the outside circuit, and between the shorting bar and the signal line. While forming the organic layer thinly in the non-display area, the organic layer near the signal line or the pad is lifted and the signal line is exposed to an etchant for patterning a transparent conductive layer.

SUMMARY OF THE INVENTION

Accordingly, it is an aspect of the present invention to provide a method of making a thin film transistor (TFT) substrate and the TFT substrate manufactured using such a method to prevent a damage of a signal line in a non-display area.

Additional aspects and/or advantages of the present invention will be set forth in part in the description which follows and, in part, may be learned by practice of the present invention.

The foregoing and/or other aspects of the present invention are also achieved by providing a method of making a thin film transistor substrate comprising: forming a shorting bar on an insulting substrate; forming a gate-insulating layer on the shorting bar; forming a data line crossing the shorting bar on the gate-insulating layer; forming a data-insulating layer and an organic coating layer on the data line; forming an organic layer to comprise a bridge organic layer hole in a predetermined area by patterning and curing the organic coating layer and to have the substantially same thickness as the organic coating layer; forming a contact hole to expose the shorting bar and the data line by etching the gate-insulating layer and the data-insulating layer using the organic layer as a mask; and connecting the shorting bar to the date line by depositing and patterning a transparent conductive layer.

The foregoing and/or other aspects of the present invention are also achieved by providing a method of making a thin film transistor substrate comprising: forming a signal line, and a shorting bar crossing the signal line on an insulting substrate, being interposed an insulating layer between the signal line and the shorting bar; forming an organic coating layer; and forming a organic layer to comprise an organic layer hole in a predetermined area by patterning and curing the organic coating layer and to have the substantially same thickness as the organic coating layer.

The foregoing and/or other aspects of the present invention are also achieved by providing a method of making a thin film transistor substrate comprising: forming a signal line, a pad connected to the signal line and a shorting bar, being interposed an insulating layer between the signal line and the shorting bar on an insulting substrate; forming an organic coating layer; and forming an organic layer to have a thicker thickness in an area near the pad than a thickness in an area near the shorting bar by patterning and curing the organic coating layer.

The foregoing and/or other aspects of the present invention are also achieved by providing a method of making a thin film transistor substrate comprising: forming a plurality of signal lines and a pad connected to the signal line to receive an outside driving signal on an insulting substrate; forming an insulating layer on the pad; forming an organic coating layer on the insulating layer; forming an organic layer pattern comprising a lateral pattern extended through a side of the pad by slit patterning the organic coating layer near the pad; forming an organic layer to comprise an organic layer hole in the middle of the pad by curing the organic layer pattern; forming a contact hole exposing the pad by etching the insulating layer using the organic layer as a mask; and forming a contact subsidiary part covering the pad exposed through the contact hole by depositing and patterning a transparent conductive layer.

The foregoing and/or other aspects of the present invention are also achieved by providing a method of making a thin film transistor substrate comprising: forming a dummy gate pads parallel to each other on an insulting substrate; forming a gate-insulating layer in an upper of the dummy gate pads; forming a data wiring to comprise a data pad provided between the dummy gate pads; forming a data-insulating layer and an organic coating layer on the data wiring sequentially; forming an organic layer pattern by slit patterning the organic coating layer near the data pad; forming an organic layer to have an organic layer hole in the middle of the date pad by curing the organic layer pattern; forming a contact hole exposing the data pad by etching the insulating layer using the organic layer as a mask; and forming a contact subsidiary part to cover the data pad exposed through the contact hole by depositing and curing a transparent conductive layer.

The foregoing and/or other aspects of the present invention are also achieved by providing a thin film transistor substrate comprising: a dummy gate pads parallel to each other formed a non-display area of an insulating substrate; a gate-insulating layer formed on the dummy gate pads; a data wiring comprising a data line provided between the dummy gate pads; a data-insulating layer formed on the data wiring line; an organic layer comprising a contact hole exposing the data-insulting layer and the data-insulating layer, formed on the date pad, formed on; and a contact subsidiary part covering the data pad exposed through the contact hole.

BRIEF DESCRIPTION OF THE DRAWINGS

The above and/or other aspects and advantages of the present invention will become apparent and more readily appreciated from the following description of the embodiments, taken in conjunction with the accompanying drawings of which.

Like reference numerals refer to corresponding parts throughout the drawings. Also, it is to be understood that the drawings are diagrammatic, and not necessarily to scale.

DETAILED DESCRIPTION OF THE PREFERRED EMBODIMENT

Figure 1:
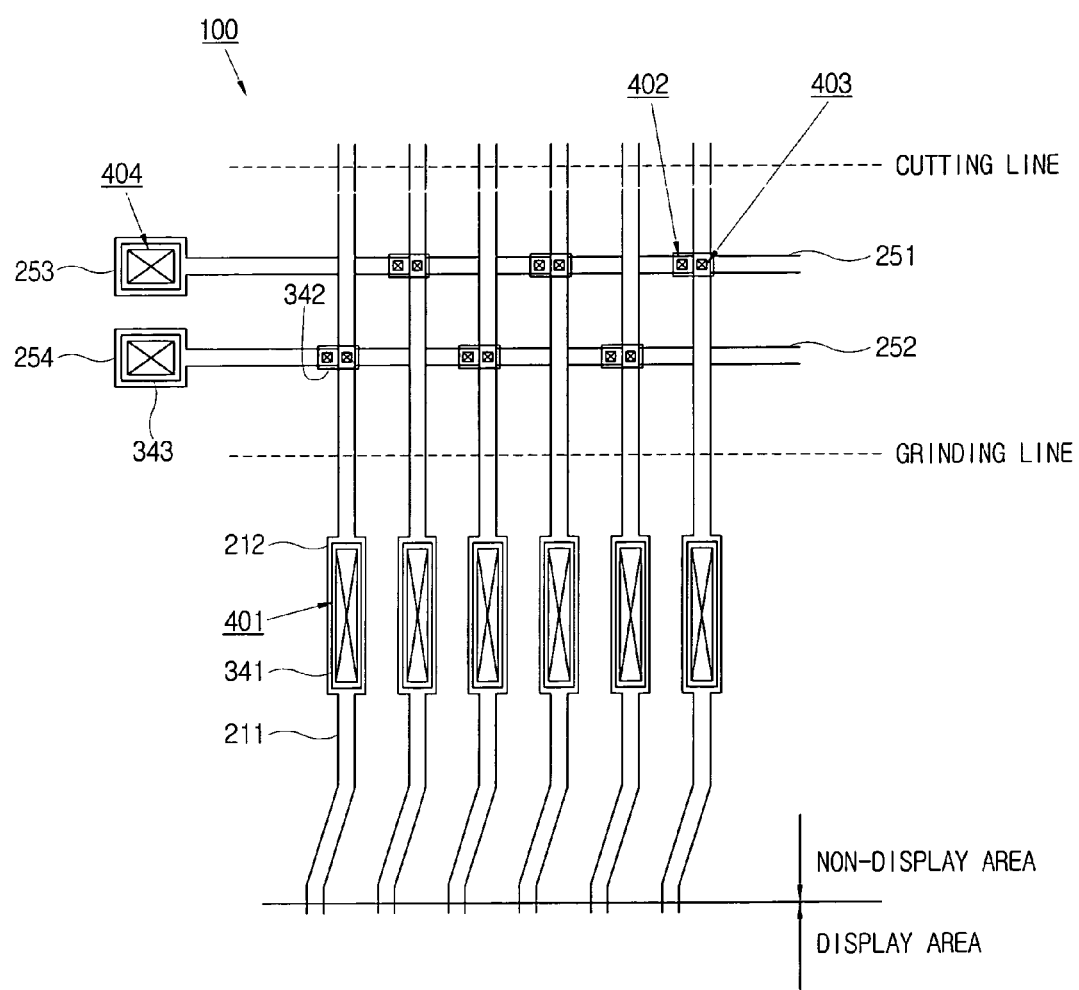
FIG. 1 is a schematic view of a thin film transistor substrate according to a first embodiment of the present invention.

Reference will now be made in detail to the embodiments of the present invention, examples of which are illustrated in the accompanying drawings, wherein like reference numerals refer to like elements throughout.

FIG. 1 is a schematic view of a thin film transistor (TFT) substrate 100 according to a first embodiment of the present invention.

A data line 211 extended from a display area is connected to a data pad 212 in a non-display area. The data line 211 is further extended from the data pad 212 to a grinding line and a cutting line. The data pad 212 is connected with an outside circuit to transmit a driving signal to the data line 211. The data lines 211 can be arranged in a generally parallel configuration. The data pads 212 connected to the data lines 211 can also be arranged in a similar configuration. A contact hole 401 is formed in the center of the data pad 212. The contact hole 401 is covered with a contact subsidiary part 341 made of a transparent conductive layer.

A first shorting bar 251 and a second shorting bar 252 are disposed outside of the grinding line, and can be generally orthogonal to the data line 211 and in parallel with each other.

The shorting bars 251, 252 are connected to the data line 211 through bridge parts 342. Each bridge part 342 interlinks a contact hole 402 exposing the shorting bars 251, 252 with a contact hole 403 exposing the data line 211. More specifically, in this embodiment, the first shorting bar 251 is connected to the even data lines 211 and the second shorting bar 252 is connected to the odd data lines 211 respectively. Here, the bridge parts 342 can be made of a transparent conductive layer such as an ITO (indium tin oxide) or an IZO (indium zinc oxide). The shorting bars 251, 252 are connected to a first array pad 253 and a second array pad 254 respectively. A contact hole 404 is formed in the array pads 253, 254 and is covered with a contact subsidiary part 343 made of the transparent conductive layer. The shorting bars 251, 252 and the array pads 253, 254 are used during an array test of the TFT substrate 100 and can be removed through an edge grinding or other material removal process after the test. The grinding line indicates the boundary of the edge grinding.

Figure 2:
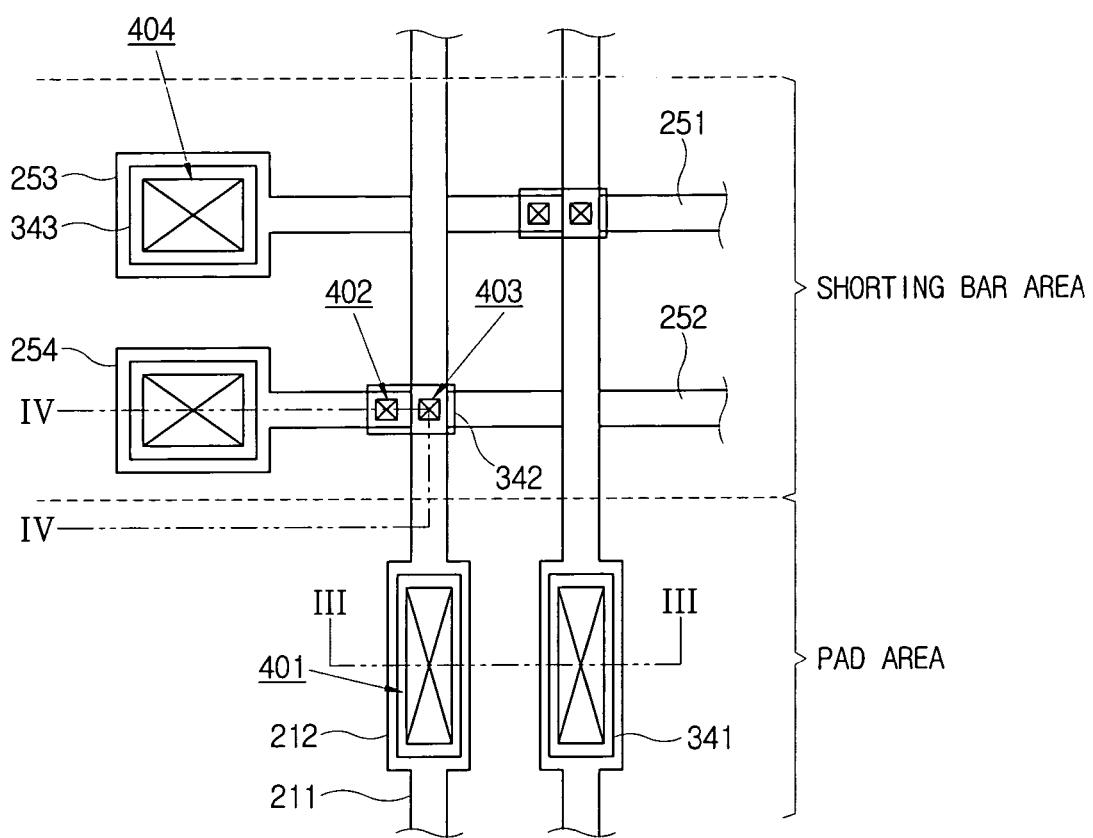
FIG. 2 is a schematic view of an arrangement of major parts in the TFT substrate according to the first embodiment of the present invention.
Figure 3:
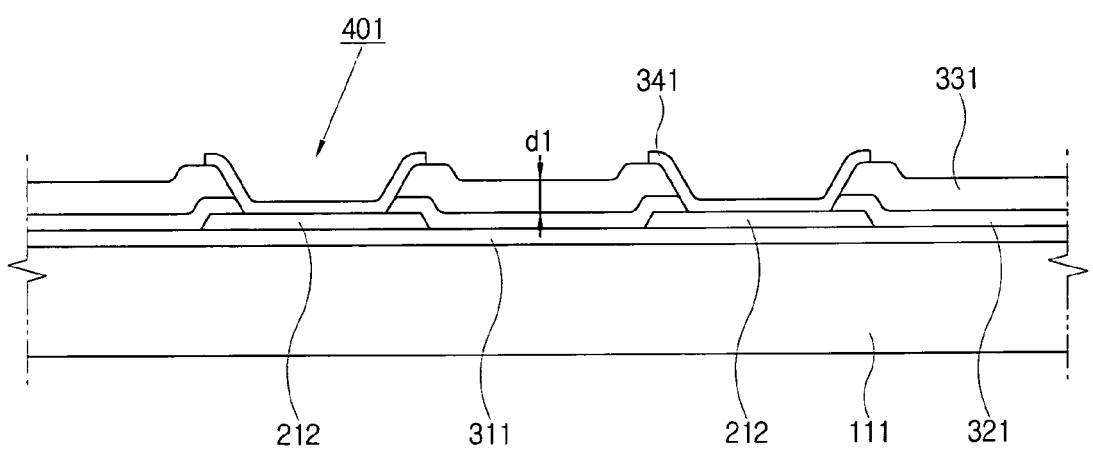
FIG. 3 is a cross sectional view taken along III-III in FIG. 2.
Figure 4:
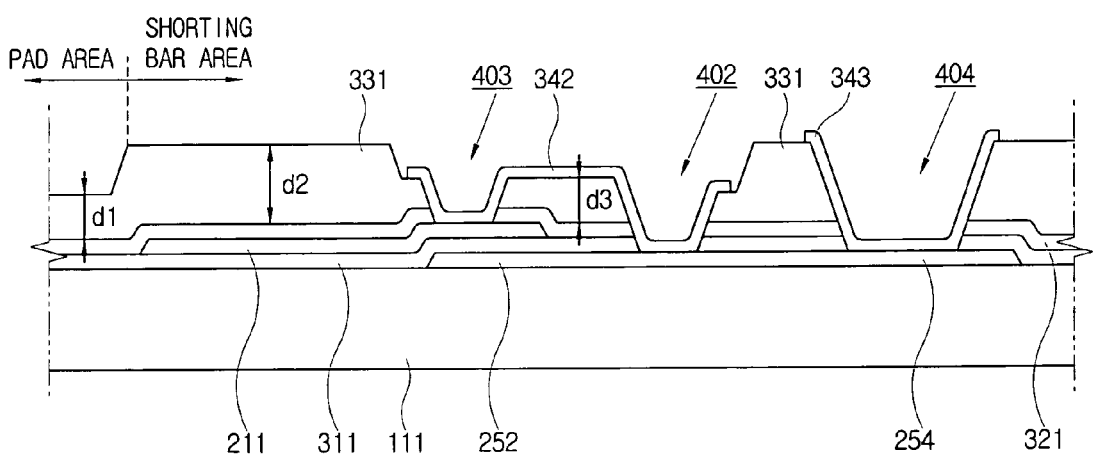
FIG. 4 is a cross sectional view taken along IV-IV in FIG. 2.

FIG. 2 is a schematic view of an arrangement of major parts in the TFT substrate according to the first embodiment of the present invention, FIG. 3 is a cross sectional view taken along III-III in FIG. 2 and FIG. 4 is a cross sectional view taken along IV-IV in FIG. 2.

A pair of shorting bars 251, 252 made of a gate wiring material are formed on an insulating substrate 111. The shorting bars 251, 252 are arranged between the grinding line and cutting line, and in parallel with each other. The array pads 253, 254 are formed in the ends of the shorting bars 251, 252. During the array test, a testing signal is applied to the array pads 253, 254. The array pads 253, 254 have a broader thickness than the shorting bars 251, 252.

A gate-insulating layer 311 that can be made of a SiNx (silicon nitride) is formed on the shorting bars 251, 252.

Data wires 211, 212 are formed on the gate-insulating layer 311. The data wires 211, 212 include the data line 211 extended from the display area, and the data pad 212 that is connected to the data line 21 and is connected with the outside circuit. The data pads 212 can be formed generally in parallel with one another. The data line 211 extends from the data pad 212 to the cutting line. The shorting bars 251, 252 and the data line 211 cross each other, and the insulating layer 311 is interposed between the signal line 211 and the shorting bars 251, 252.

A data-insulating layer 321 and a organic layer 331 are sequentially formed on the data wiring lines 211, 212 and the gate-insulating layer 311 not covered with the data wiring lines 211, 212. The data-insulating layer 321 can also be made of SiNx similar to the gate-insulating layer 311. The organic layer 331 can be made of at least one of benzocyclobutane (BCB), olefin resin, acrylic resin, polyimide, Teflon, cytop and perfluorocyclobutane (PECB).

A thickness (d1) of the organic layer 331 near the pad 212 (pad area), which may be about 1 μm, is preferably thinner than the organic layer 331 formed in the display area. In contrast, a thickness (d2) of the organic layer 331 near the shorting bars 251, 252 (the shorting bar area), which may be about 3 μm, is approximately the same thickness as the organic layer 331 formed in the display area. A boundary between the pad area and the shorting bar area where the thickness of the organic layer 331 varies corresponds to the grinding line or lies adjacent to it.

The data-insulating layer 321 and the organic layer 331 on the data pad 212, the shorting bars 251, 252, the data line 211 and the array pads 253, 254 collectively help form the contact holes 401, 402, 403, 404. The gate-insulating layer 311 is also removed in the contact holes 402, 403 exposing the shorting bars 251, 252 and the array pads 253, 254.

The data pad 212 and the array pads 253, 254 exposed through the contact holes 401, 404 are covered with the contact subsidiary parts 341, 343. The contact subsidiary parts 341, 343 can be made of a transparent conductive layer such as ITO or the IZO.

The shorting bars 251, 252 and the data line 211 exposed through the contact holes 402, 403 are electrically connected to each other by the bridge part 342. The bridge part 342 is also made of the transparent conductive layer.

Here, a thickness (d3) of the organic layer 331 around the contact holes 402, 403 exposing the shorting bars 251, 252 and the data line 211 is similar to the thickness (d1) of the organic layer 331 adjacent to the pad 212. Accordingly, the height difference between the shorting bars 251, 252 and the data line 211 is relatively small, allowing the bridge part 342 to be formed stably. Meanwhile, the contact subsidiary part 343 covering the array pads 253, 254 may be formed stably as the contact hole 404 is formed relatively wide, even though the thickness (d2) of the organic layer 331 around the array pads 253, 254 is thick.

Hereafter, a method of fabricating the TFT substrate according to the first embodiment of the present invention will be described in detail by referring to FIGS. 5a through 8c.

FIG. 5a, FIG. 6a, FIG. 7a and FIG. 8a illustrate an arrangement of major parts according to each fabrication step. FIG. 5b, FIG. 6b, FIG. 7b and FIG. 8b are cross sectional views of the pad area and FIG. 5c, FIG. 6c, FIG. 7c and FIG. 8c are cross sectional views of the shorting bar area.

Figure 5A:
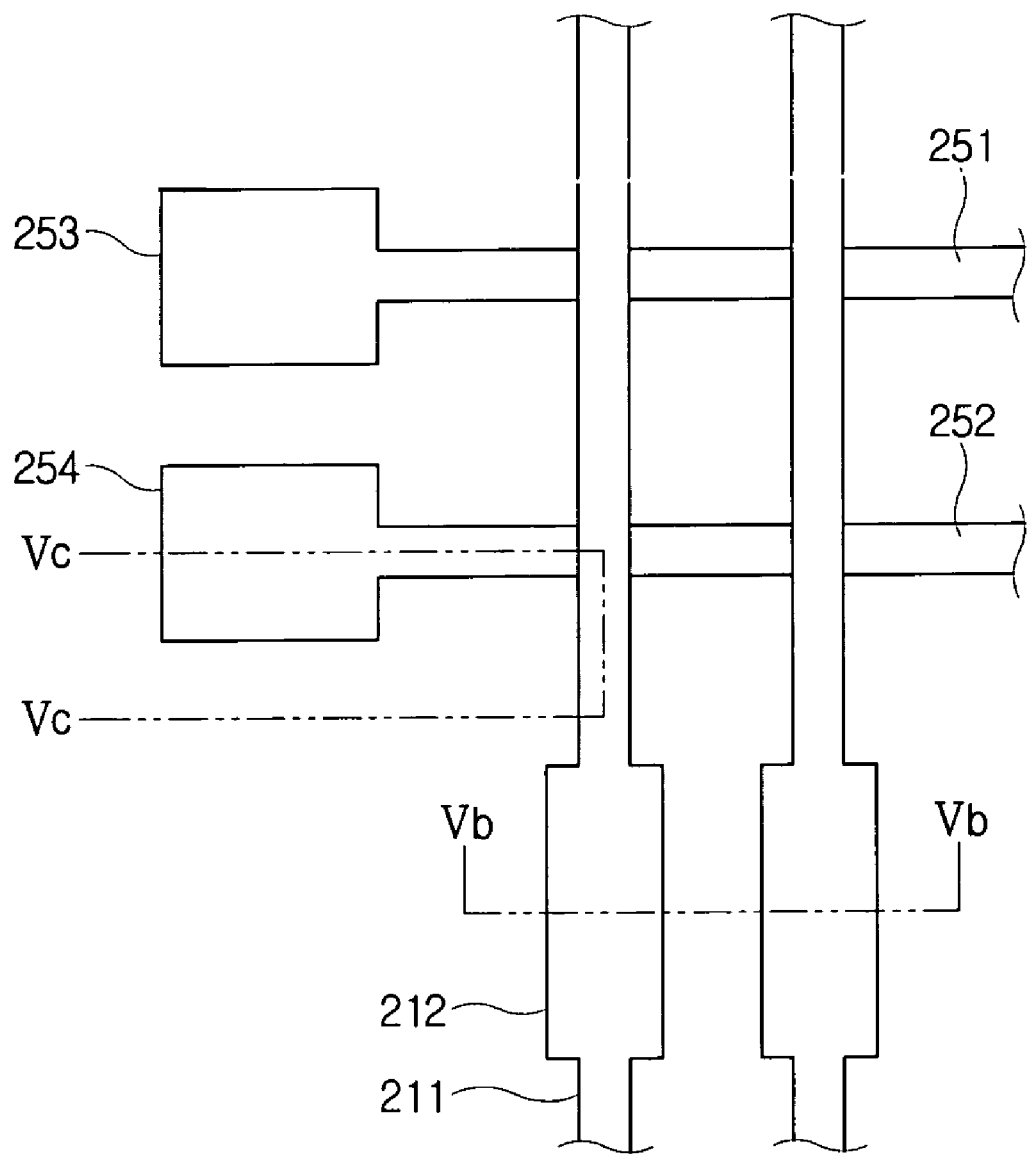
FIGS. 5a through 8c are schematic views describing a method of making the TFT substrate according to the first embodiment of the present invention.
Figure 5B:
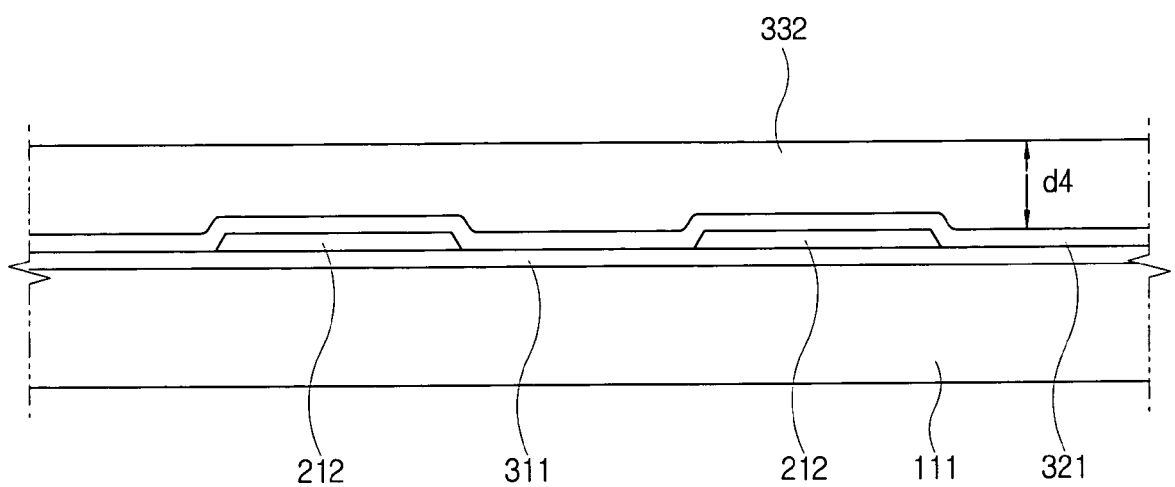
Figure 5C:
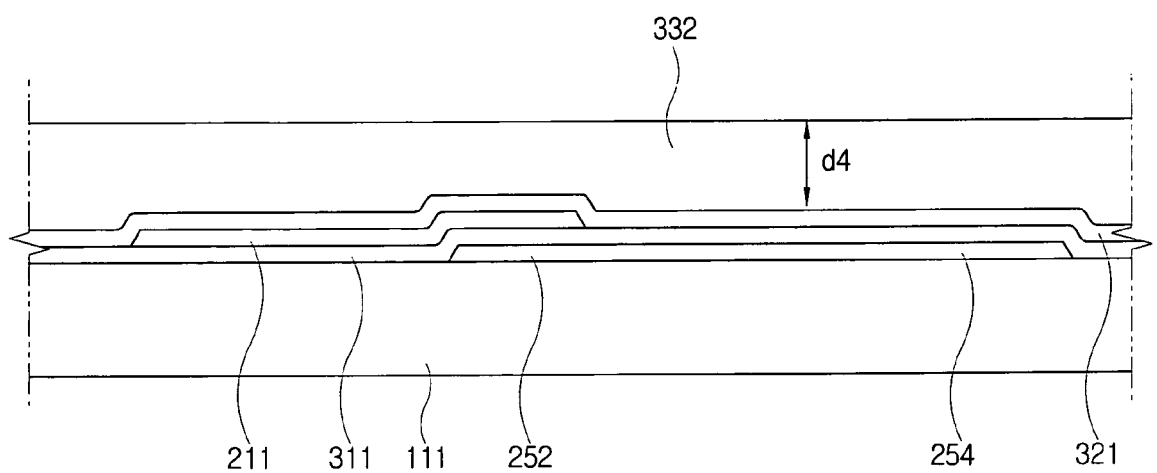

First, as shown in FIGS. 5a through 5c, a gate wiring is deposited and patterned to form the shorting bars 251, 252 and the array pads 253, 254 connected to the shorting bars 251, 252 on the insulating substrate 111. Then, the gate-insulating layer 311 and the data wiring 211, 212 are formed. The gate-insulating layer 311 can be formed by depositing SiNx through a PECVD process. The data wires 211, 212 are formed, typically by depositing the data wiring line matter through sputtering and subsequent patterning. Afterward, the data-insulting layer 321 can be formed similar to the gate-insulting layer 311, and an organic coating layer 332 is formed over the whole TFT substrate. To form the organic coating layer 332, a spin coating or a slit coating can be performed. Here, the thickness (d4) of the organic layer 332 is preferably on the order of about 3 μm, in order to improve the aperture ratio.

Figure 6A:
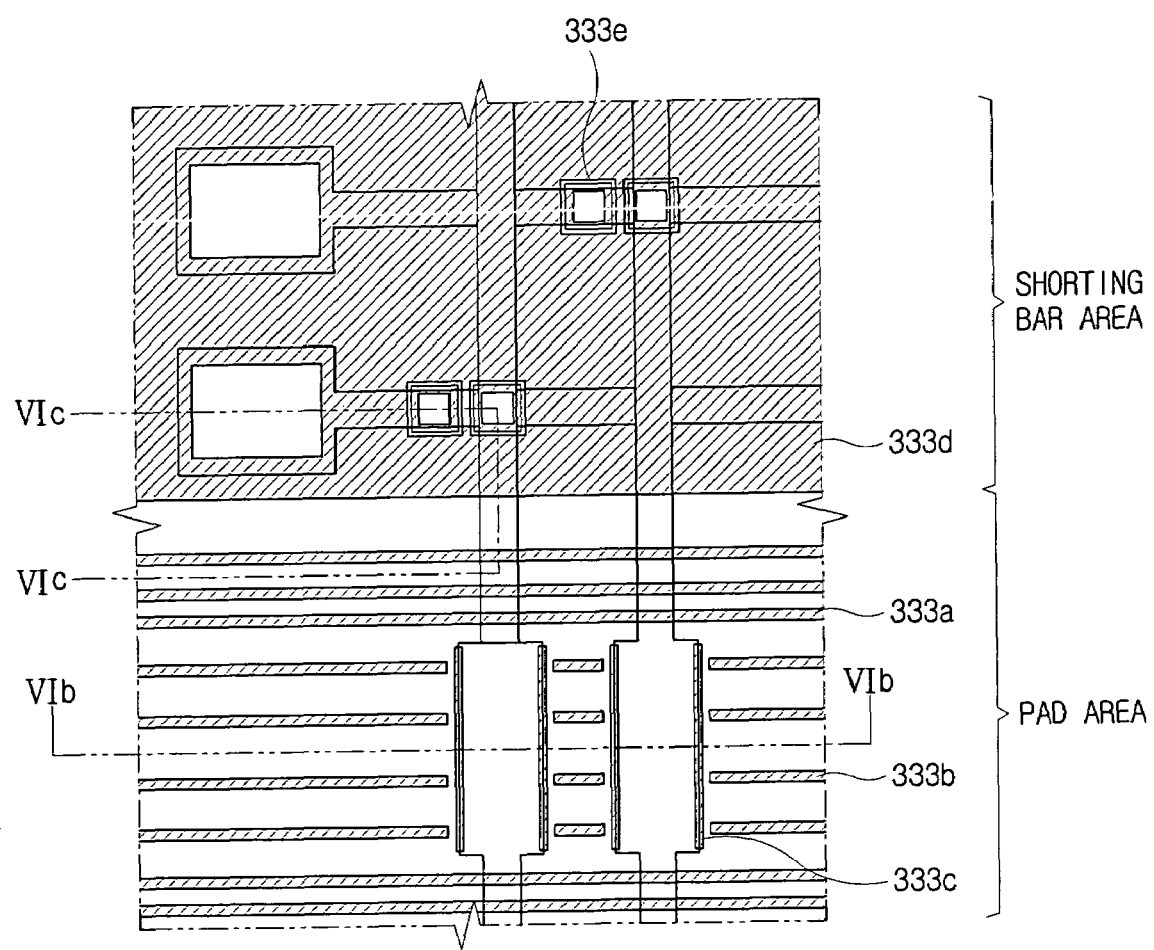
Figure 6B:
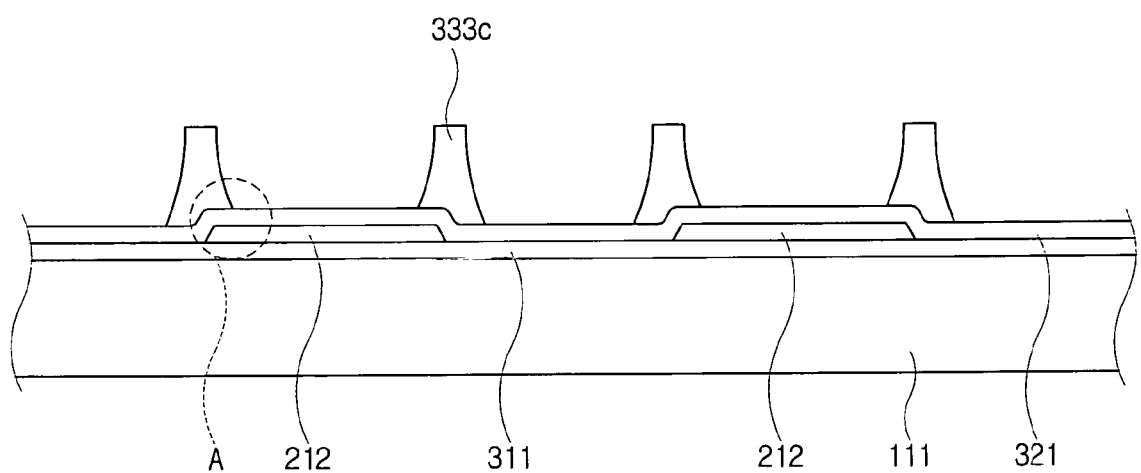
Figure 6C:
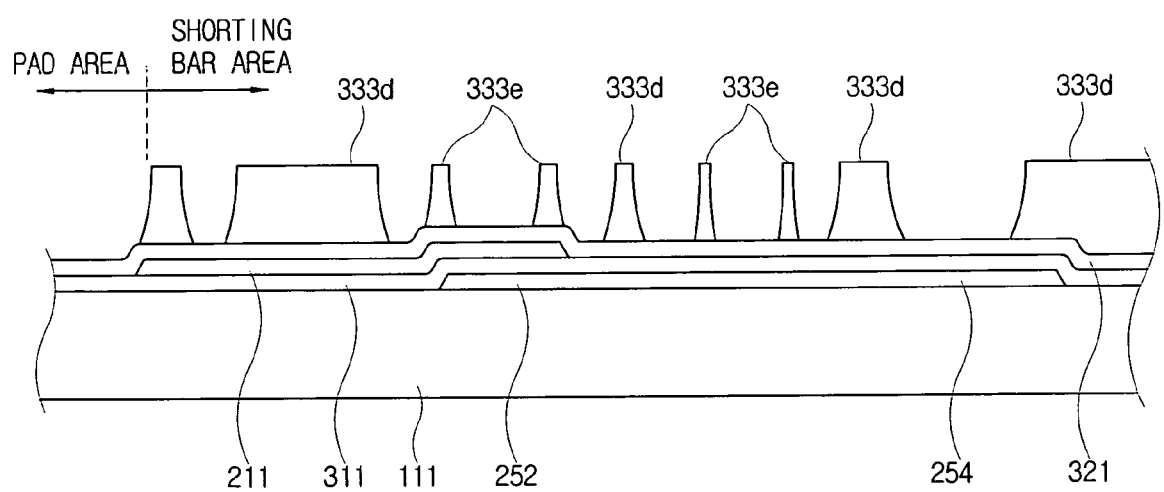

As shown in FIGS. 6a through 6c, an organic layer pattern 333a through 333e is formed by exposing and developing the organic coating layer 332. Here, the organic coating layer 332 in the pad area is exposed by a slit mask.

Meanwhile, the shorting bar area is not exposed by the slit mask, except a portion where the contact holes 402, 403 are to be formed. As above, the contact holes 402, 402 expose the shorting bars 251, 252 and the data line 211. Slit exposing in the pad area makes the connection between the data pad 212 and the outside circuit stable by lowering the height of the organic layer 331 around the data pad 212.

Thus, in the pad area, a pad external pattern 333a disposed at an upper and a lower portion of the data pad 212, a pad intermediate pattern 333b disposed between the adjacent data pads 212 and a lateral pattern 333c disposed along a side of the data pad 212 are formed. Moreover, a pattern 333d having the shape of the organic coating layer 332 is formed in the almost whole shorting bar area. A bridge pattern 333e is formed on a portion where the contact holes 402, 403 to be made. The bridge pattern 333e encloses the portion where the contact holes 402, 403 are to be made. Among the organic layer patterns 333a through 333e, the pad external pattern 333a, the pad intermediate pattern 333b, the lateral pattern 333c and the bridge pattern 333e can be slit patterns formed by exposing with the slit mask.

The pad external pattern 333a and the pad intermediate pattern 333b are disposed generally orthogonal to an extending direction of the data line 211, and the lateral pattern 333c is disposed generally parallel with the extending direction of the data line 211. The organic patterns 333a through 333e are not formed in the middle area of the data pad 312, a portion around the contact holes 402, 403 and the middle area of the array pads 253, 254 in order to form organic layer holes 405 through 408.

Here, a contact area between the pad intermediate pattern 333b and the insulating layer 321 is not large because the pad intermediate pattern 333b is short. Thus, a lifting of the pad intermediate pattern 333b is generated during developing and the data-insulating layer 321 may be exposed. The exposed data-insulating layer 321 is etched during the etching process of the data-insulating layer 321, forming the contact hole 401. An etchant, for etching the transparent conductive layer to form the contact subsidiary part 341, may be introduced through the data-insulating layer 321 etched. Because the data lines 211, 212 are not formed in a lower part of the pad intermediate pattern 333b, even though the etchant for the transparent conductive layer is introduced the opening of the data line 211 does not happen.

Contrary to the pad intermediate pattern 333b, if the lifting is generated in the lateral pattern 333c, the data pad 212 is etched by the etchant for the transparent conductive layer. In particular, the opening of the data line 211 becomes serious when the data lines 211, 212 are made of chrome, because the etchant for the transparent conductive layer also etches chrome. However, in the lateral pattern 333c, little or no lifting occurs, because the lateral pattern 333c according to the first embodiment has a wide contact area with the data-insulating layer 321. Thus, the data-insulating layer 321 formed on a side portion (A) of the data pad 212 is adequately protected by the lateral pattern 333c during the etching.

Lifting of the pad intermediate pattern 333b may also occur in the data line 211 of the shorting bar area. However, according to the first embodiment, slit exposing is not performed in the shorting bar area, except in the portion where the contact holes 402, 403 are to be formed, so so as to reduce the risk of damage to the data line 211.

Figure 7A:
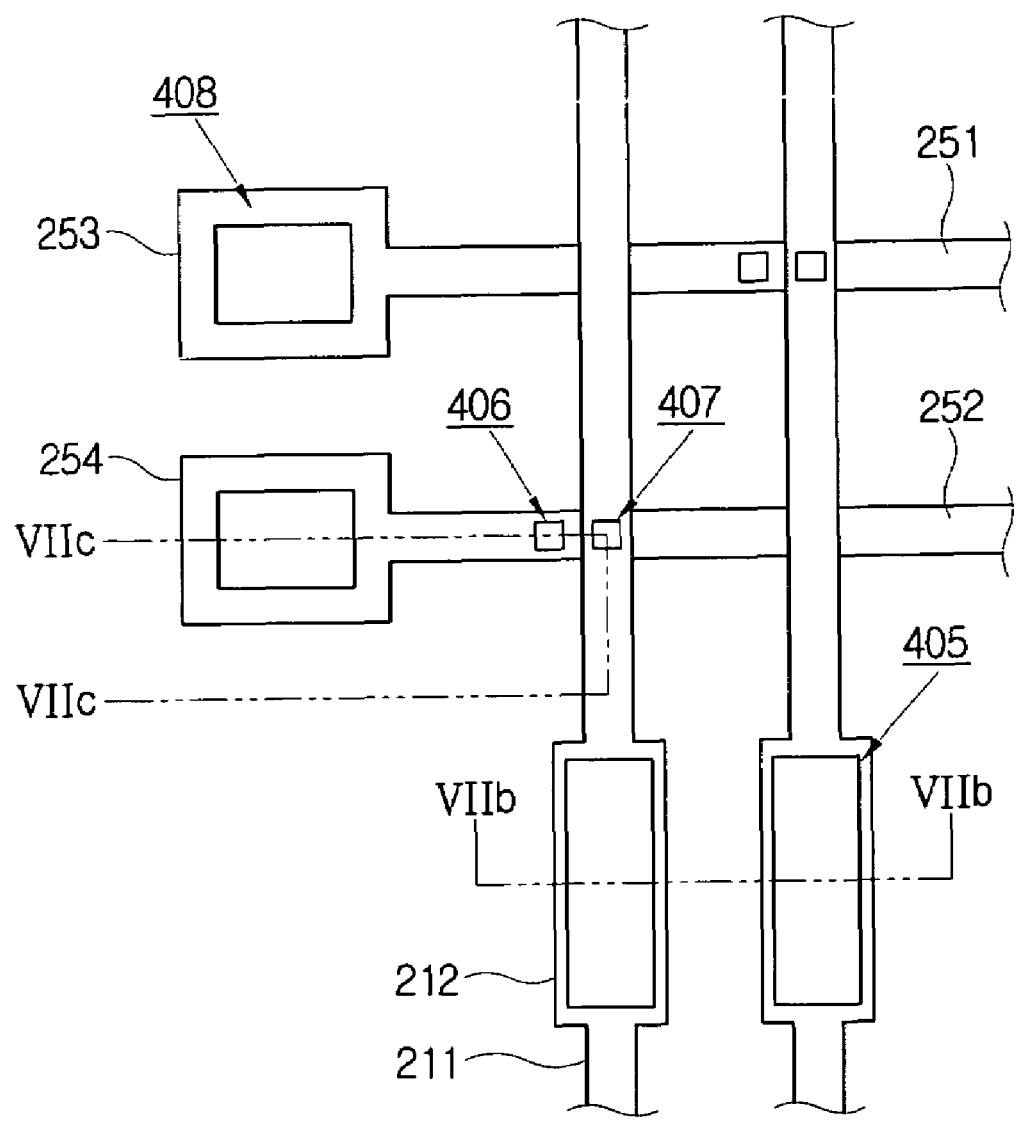
Figure 7B:
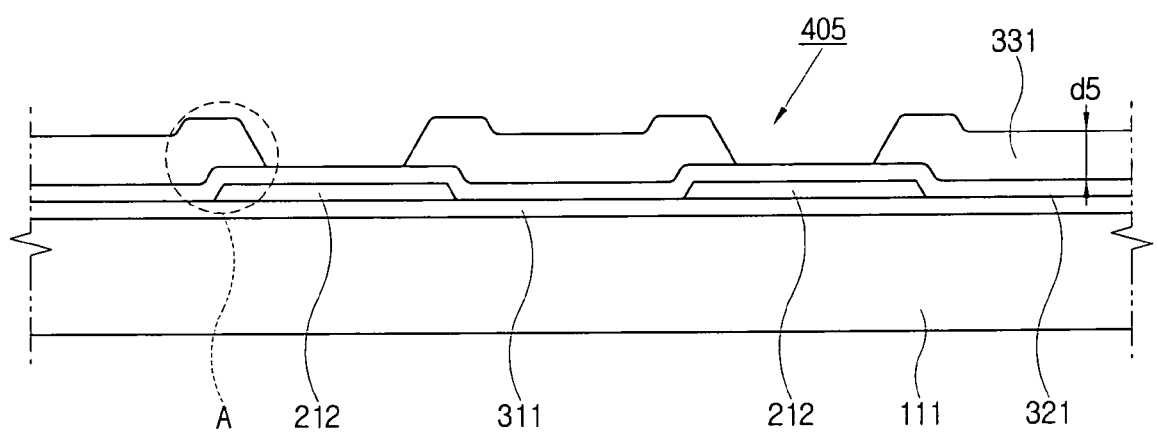
Figure 7C:
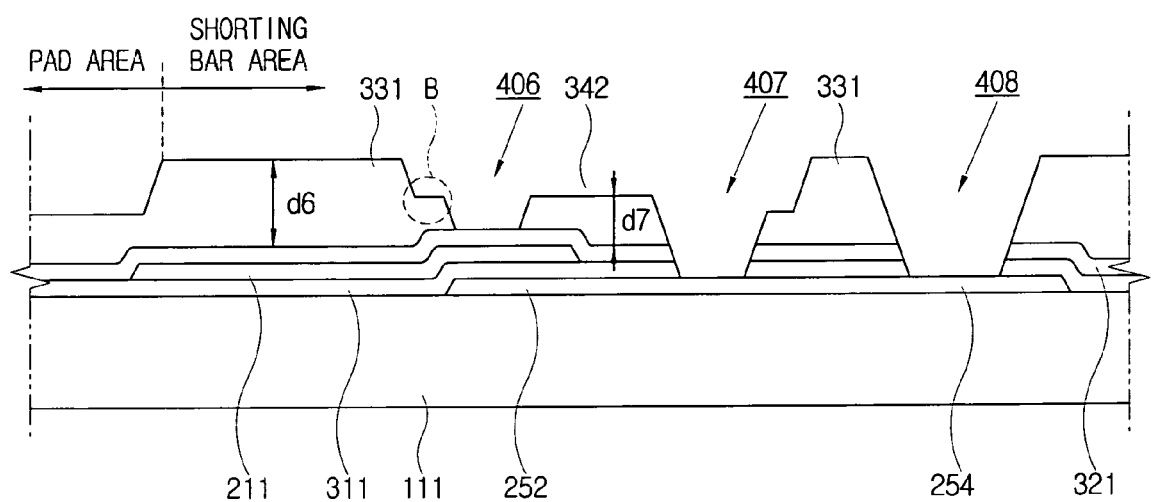

As shown in FIG. 7a through FIG. 7c, the organic layer 331 is formed by curing the organic layer patterns 333a through 333e. The curing is performed at about 200° C. and the organic layer patterns 333a through 333e flow and flatten at this temperature.

A thickness (d5) of the organic layer 331 is preferably less than half the thickness (d4) of the organic coating layer 332 in the pad area. The pad organic layer hole 405 is formed in the middle of the data pad 212 because the organic layer pattern 333a through 333e does not flow into the hole 405. The data-insulating layer 321 and the organic layer 331 are normally formed in the side portion (A) of the data pad 212 because the lateral pattern 333c is not lifted.

In the shorting bar area, a thickness (d6) of the organic layer 331 formed from the remained pattern 333d is often substantially similar to the thickness (d4) of the organic coating layer 332 because the thickness (d6) of the organic layer 331 does not decrease during curing. A thickness (d7) of the organic layer 331 in a portion where the bridge pattern 333e is formed is often similar to the thickness d5 of the organic layer 331 in the pad area. Bridge organic layer holes 406, 407 and an array organic layer hole 408 are formed on a predetermined area on the shorting bars 251, 252, and a predetermined area on the data line 221, and on the array pads 253, 254 respectively, because the organic layer patterns 333a through 333e do not flow therein. Here, a shoulder part (b) of the double step shape is formed from the organic layer 331 around the bridge organic layer holes 406, 407. The shoulder part makes a bridge part 342, which will be described hereafter.

Figure 8A:
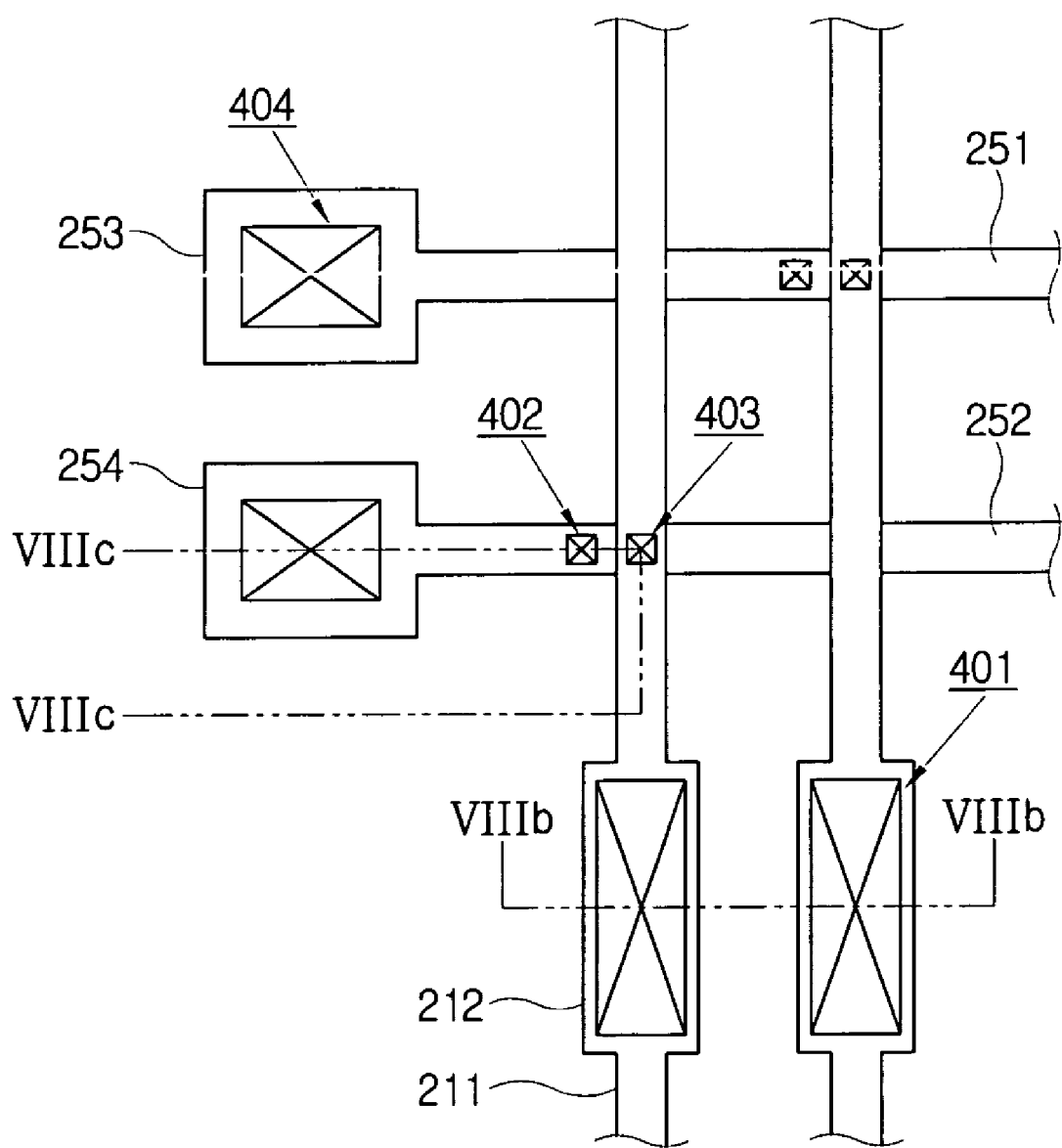
Figure 8B:
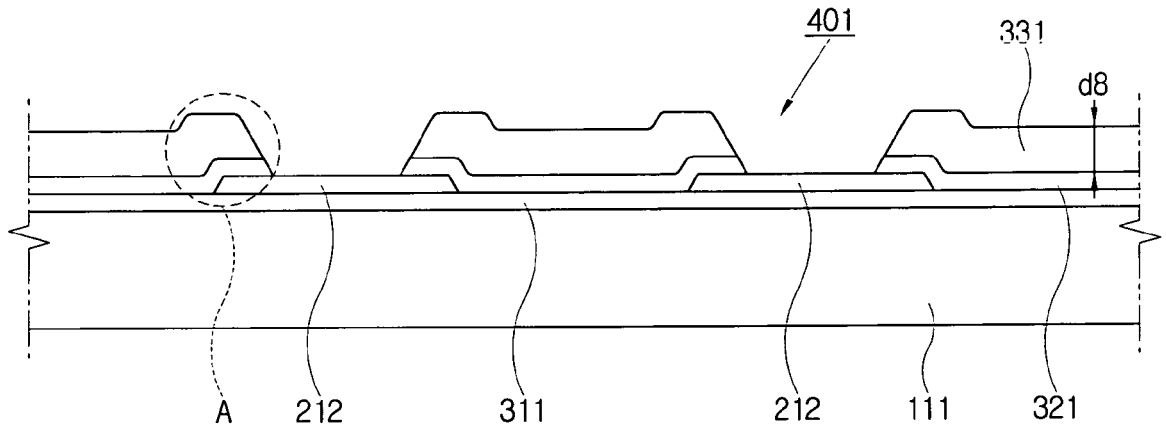
Figure 8C:
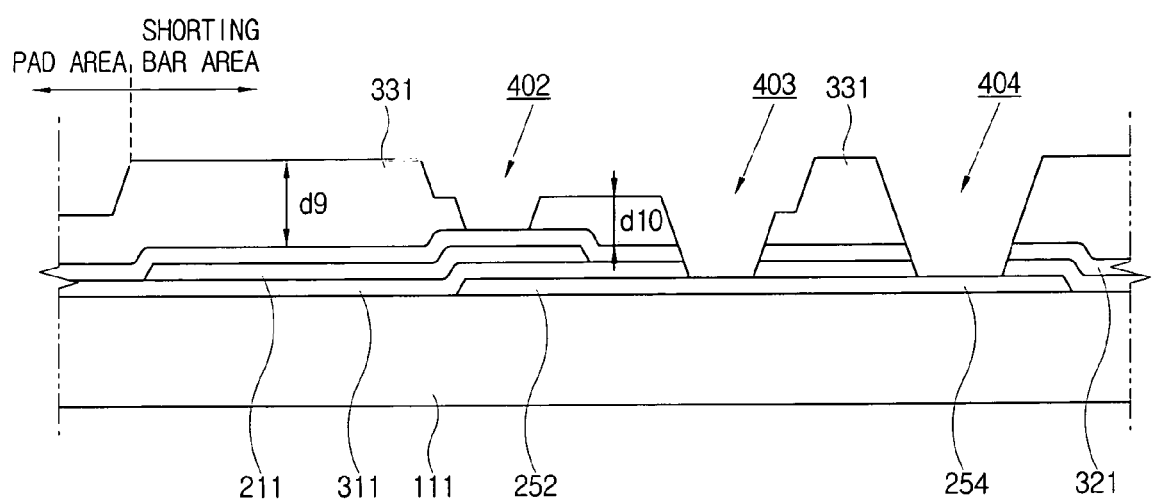

Afterward, as shown in FIGS. 8a through 8c, the contact holes 401 through 404 exposing the data pad 212, the shorting bars 251, 252, the data line 211 and the array pads 253, 254 are formed by etching the data-insulating layer 321 using the organic layer 331 as a mask. Generally, dry etching can be used to etch the data-insulating layer 321. The gate-insulating layer 311 is also removed in the contact holes 402, 403 exposing the shorting bars 251, 252 and the array pads 253, 254. The thicknesses d8, d9, d10 of the organic layer 331 are decreased during etching of the data-insulating later 321. Here, the organic layer 331 protects the data-insulating layer 321 disposed along a side of the data pad 212. Moreover, the organic layer 331 also protects the data line 211 in the shorting bar area.

Subsequently, the contact subsidiary part 341 covering the data pad 212 exposed by the contact hole 401, the bridge part 342 electrically connecting the data line 211 and the shorting bars 251, 252 exposed by the contact holes 402, 403 and the contact subsidiary part 343 covering the array pads 253, 254 exposed by the contact hole 404 can be formed by depositing the transparent conductive layer and patterning it, thus the TFT substrate 100 is completed in FIGS. 2 through 4. Even though etchant is used in patterning the transparent conductive layer, the side of the data pad 212 is not damaged by the etchant for the transparent conductive layer, because the date-insulating layer 321 and the organic layer 331 protect the date pad 212. The data line 211 of the shorting bar area is not damaged by the etchant for the transparent conductive layer because the organic layer 331 also protects the data line 212. The thicknesses d1, d2, d3 of the organic layer 331 are decreased during etching of the data-insulating layer 321.

Next, a test signal is applied to the array pads 253, 254 for an array test. The test signal applied to the array pad 253 connected to a first shorting bar 251 is applied to the even data line 211 and the testing signal applied to the array pad 254 connected to a second shorting bar 252 is applied to the odd data line 211.

After the array test, the shorting bars 251, 252 can be removed by edge grinding so that electrical connection between the shoring bar 251, 252 and the data line 211 is cut off.

The type and number of the bridge patterns 333e are not limited to those shown in the first embodiment. Moreover, if the bridge pattern 333e is modified, features of the bridge part 342 and the contact holes 302, 303 can be changed.

Figure 9:
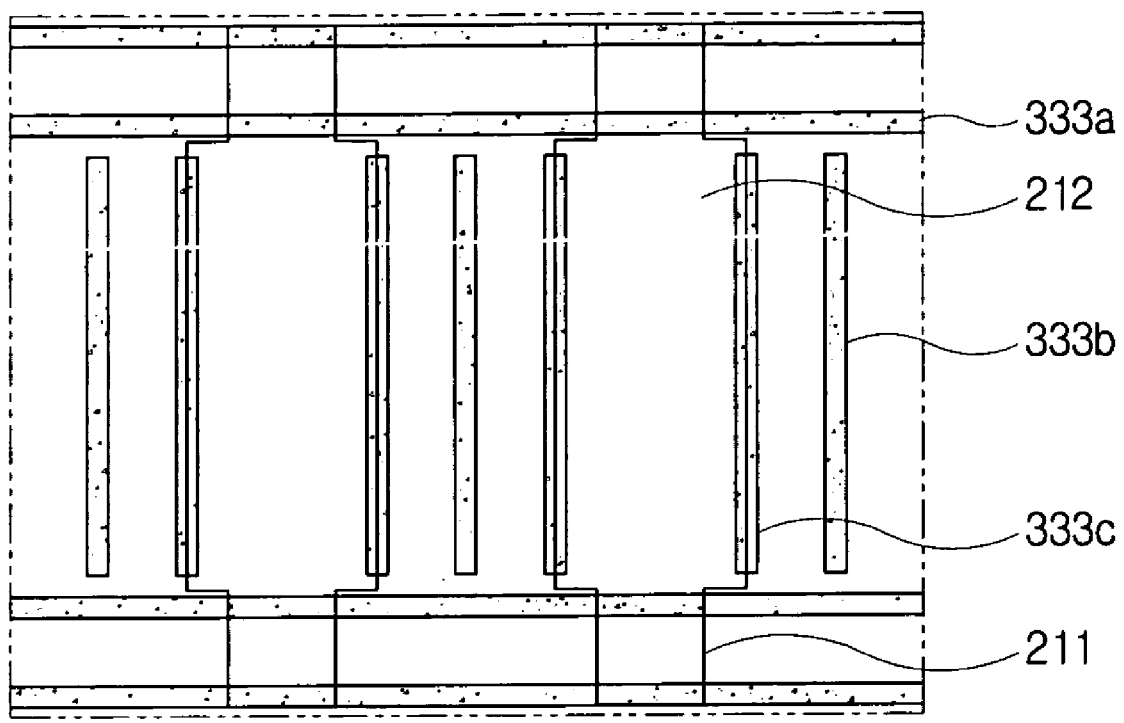
FIG. 9 is a schematic view describing another method of making the TFT substrate according to the first embodiment of the present invention.

Another method of fabricating the TFT substrate according to the first embodiment will be explained in detail by referring to FIG. 9. FIG. 9 is an arrangement view of the TFT substrate provided with the organic layer patterns 333a, 333b and 333c by exposing and developing the organic coating layer 332, and shows only the pad area.

The pad intermediate pattern 333b is disposed generally in parallel with the extending direction of the data line 211. Accordingly, the contact area between the pad intermediate pattern 333b and the data-insulating layer 231 is increased, thus preventing lifting of the height of the pad intermediate.

Contrary to FIG. 9 the pad external pattern 333a may be formed in parallel with the extending direction of the data line 211.

Figure 10:
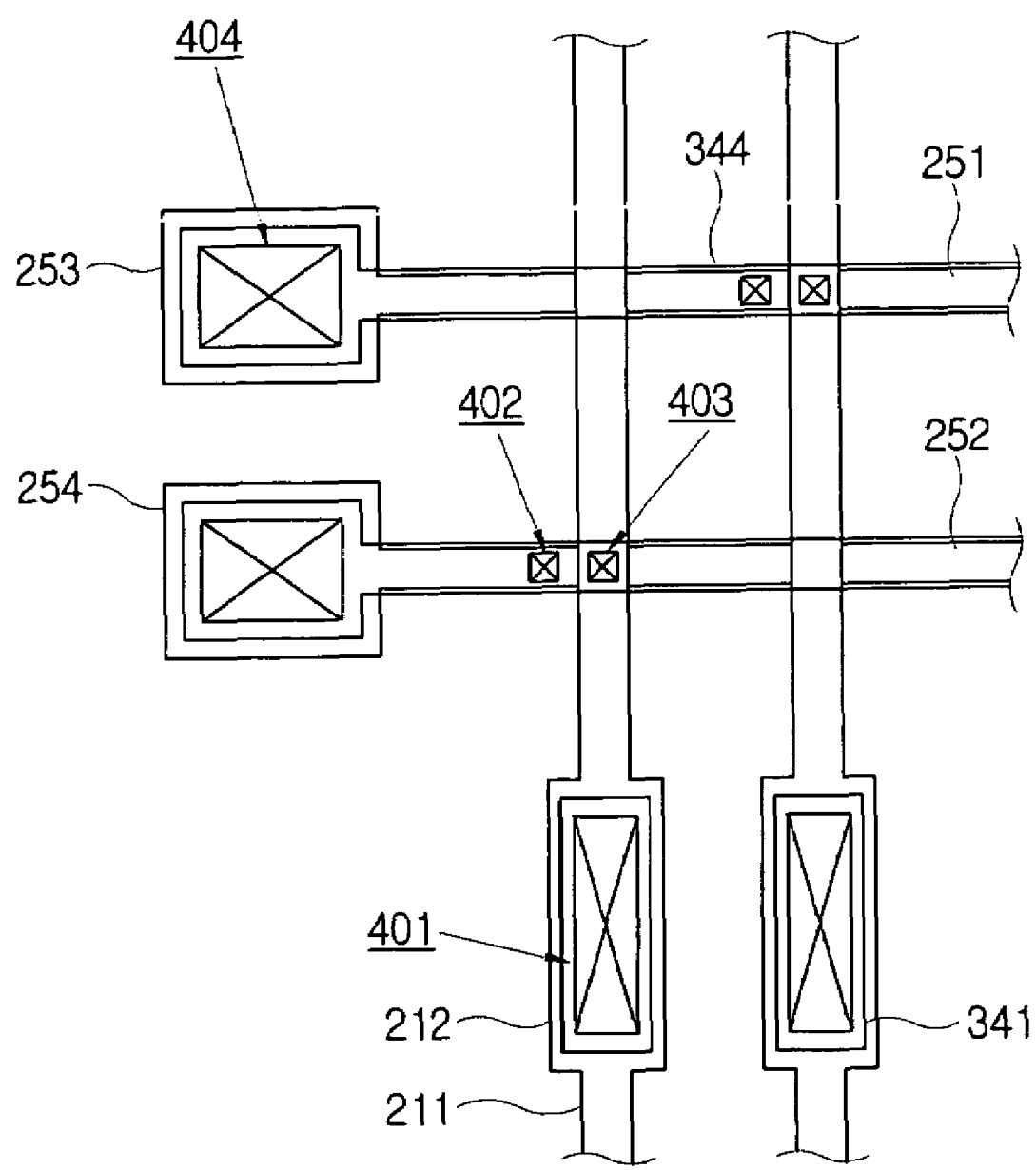
FIG. 10 is a schematic view of an arrangement of major parts in a TFT substrate according to a second embodiment of the present invention.

The TFT substrate 100 according to a second embodiment of the present invention will be described by referring to FIG. 10.

According to the second embodiment, a pair of contact subsidiary parts 344 disposed along the shorting bars 251, 252. The contact subsidiary part 344 functions as both the bridge part 342 and the contact subsidiary part 343 in the first embodiment. The method of making the TFT substrate according to the second embodiment can be the same as the first embodiment, except for the patterning of the transparent conductive layer to form the contact subsidiary part 344.

Figure 11:
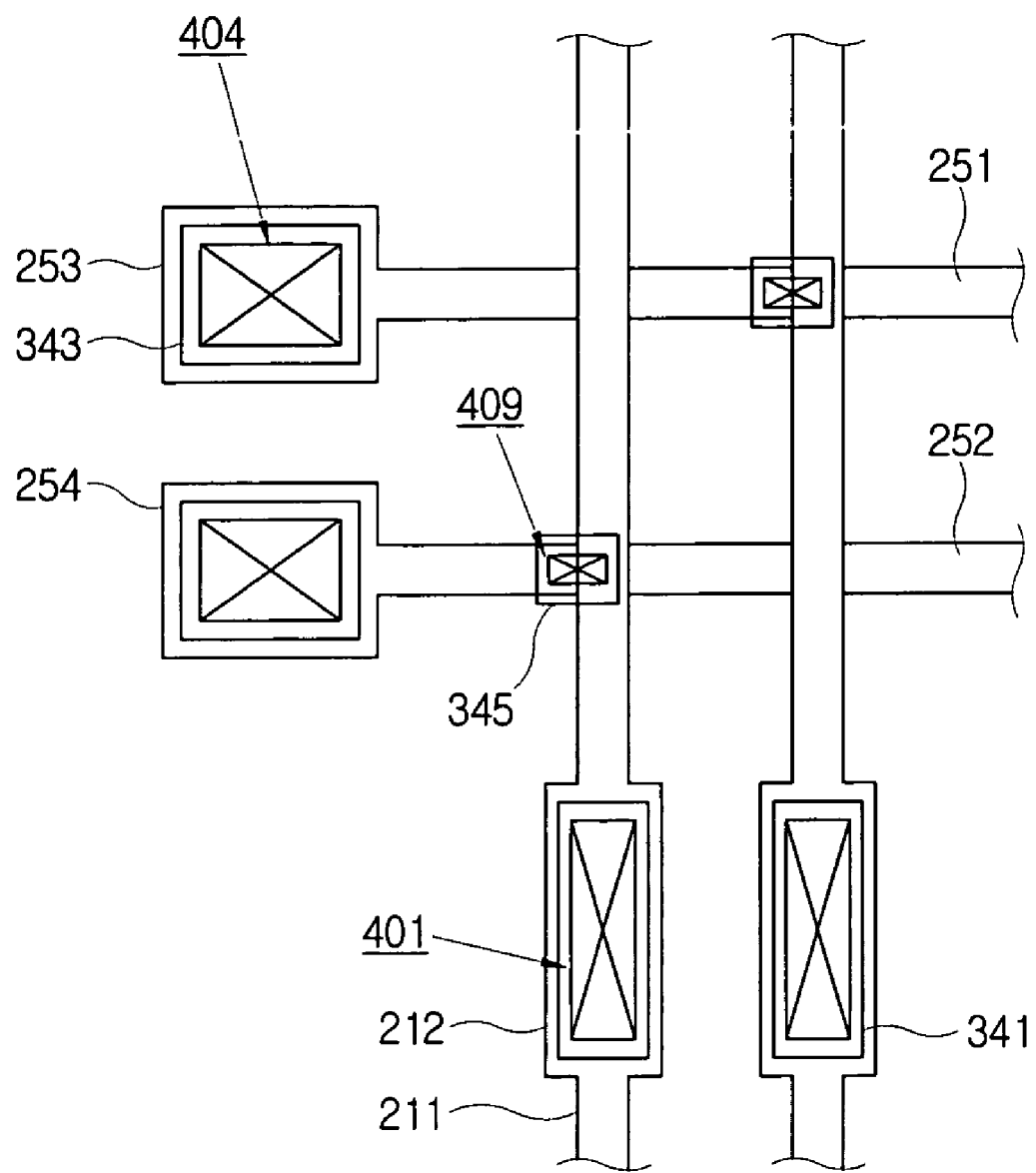
FIG. 11 is a schematic view of an arrangement of major parts in a TFT substrate according to a third embodiment of the present invention.

The TFT substrate 100 according to a third embodiment of the present invention will be described by referring to FIG. 11.

In the TFT substrate 100 according to the third embodiment of the present invention, the shorting bars 251, 252 and the data line 211 are exposed by a contact hole 409. The contact hole 409 is covered with a contact subsidiary part 345. In the fabrication process of the TFT substrate 100 according to the third embodiment, the bridge pattern 333e is formed to overlap the boundary between the shorting bars 251, 52 and the data line 211.

The TFT substrate 100 according to a fourth embodiment of the present invention will be described by referring to FIGS. 12 and 13.

Figure 12:
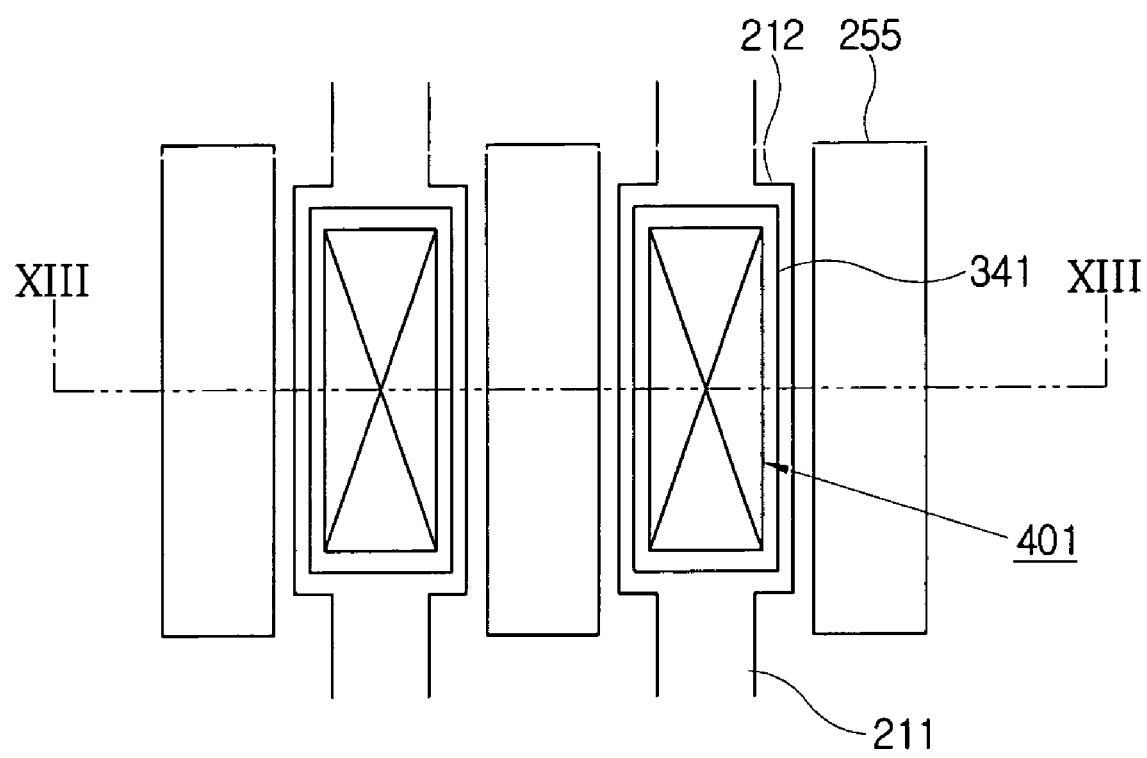
FIG. 12 is a schematic view of an arrangement of major parts in a TFT substrate according to a fourth embodiment of the present invention.
Figure 13:
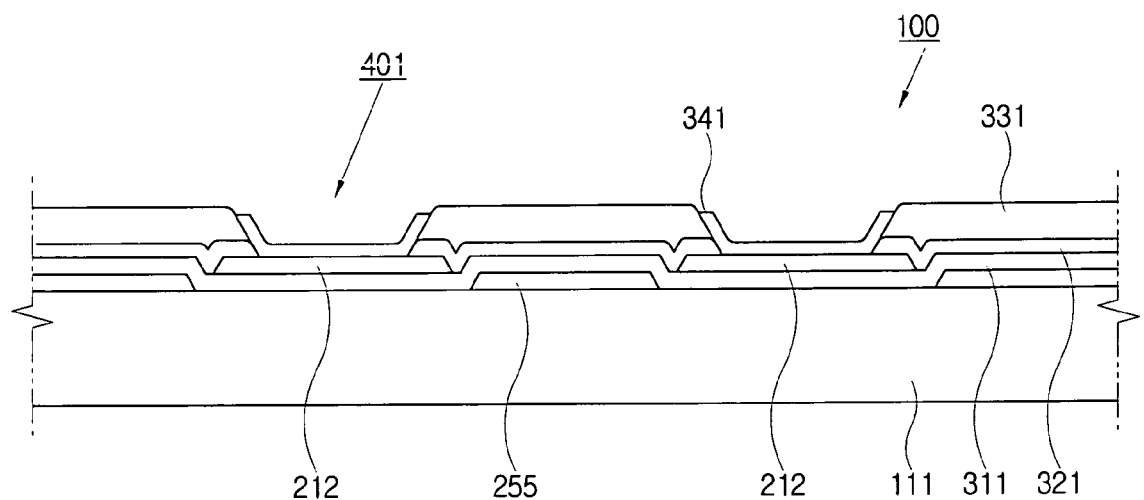
FIG. 13 is a cross sectional view taken along X III-X III in FIG. 12.

FIG. 12 illustrates an arrangement of major parts according to the TFT substrate 100 according to the fourth embodiment, and shows the pad area. FIG. 13 is a cross sectional view taken along X III-X III in FIG. 12.

A plurality of dummy gate pads 255 are formed on the insulating substrate 111. The dummy gate pads 255 are shaped like an island and are disposed to the non-display area in parallel and at the same intermediate.

The gate-insulating layer 311 is formed on the dummy gate pads 255. The data pad 212 is formed on the gate-insulating layer 311 between the adjacent dummy gate pads 255. The data-insulating layer 321 and the organic layer 331 forming the contact hole 401 are formed on the data pad 212. The data pad 212 exposed by the contact hole 401 is covered with the contact subsidiary part 341.

The function of the dummy gate pads 255 will be explained in detail as follows, by referring to FIGS. 14 and 15.

Figure 14:
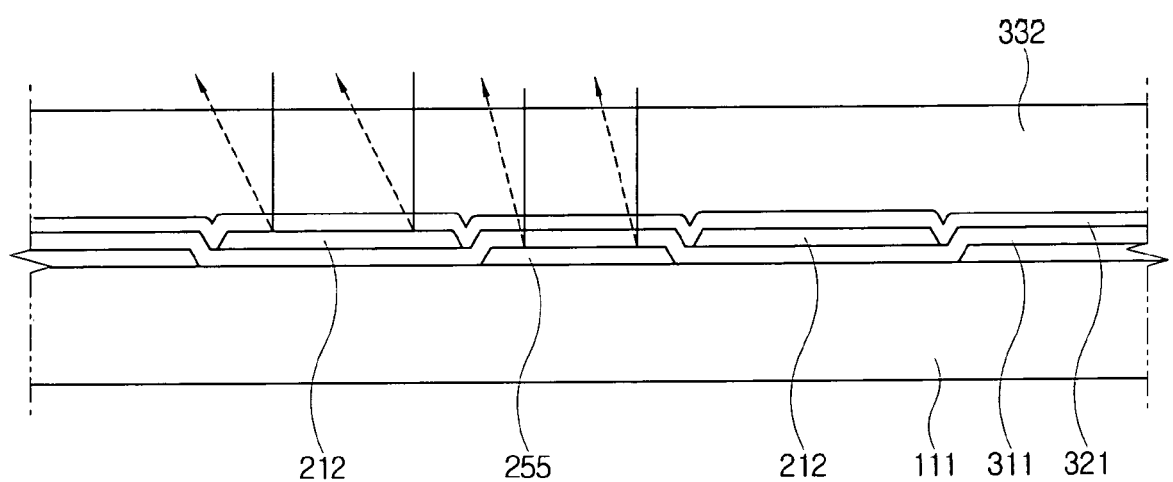
FIGS. 14 and 15 are schematic views describing a method of making the TFT substrate according to the forth embodiment of the present invention.

FIG. 14 illustrates the exposing of the organic coating layer 332 to light. While an identical mask is used in patterning the organic coating layer 332, the degree of exposure of the organic coating layer 332 formed on the data pad 212 is different from that of the other portions of the organic coating layer 332. This is due to the fact that the organic coating layer 332 formed on the data pad 212 is less influenced by the reflected light from the data pad 212. The uneven degree of exposure may cause lifting of the organic coating layers 333a, 333b, and 333c. In particular, if the lifting occurs between the data pads 212, the data pad 212 may be damaged by the etchant for the transparent conductive layer.

However, the dummy gate pads 255 of the fourth embodiment allow for uniform exposure of both the organic coating layers 332 disposed between the data pads 212 and those disposed on the data pad 212.

Figure 15:
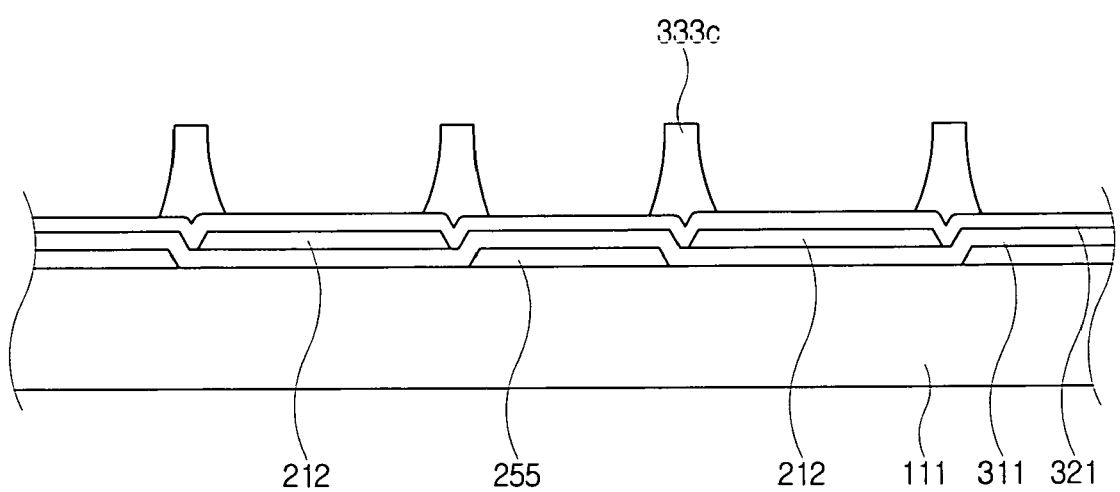

FIG. 15 shows forming of the organic layer patterns 333a, 333b and 333c by developing the organic coating layer 332. The data-insulating layer 321, where the lateral pattern 333c is located thereon, is formed relatively flat. The dummy gate pads 255 disposed between the data pads 212 make the data pad 212 flattened. The lateral pattern 333c is stably provided between the flat data pads 212, thus possibility of the lifting decreases.

Though the foregoing embodiments refer to the data line 211 as a signal line and the data pad 212 as a pad, they can also be applied to the gate line and the gate pad. Moreover, the organic layer patterns 333a through 333c may be modified as required.

As described, the present invention provides a method of fabricating a TFT substrate so as to prevent damage to the signal lines in non-display areas.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A thin film transistor substrate comprising:
   dummy gate pads parallel to each other formed on a non-display area of an insulating substrate;
   a gate-insulating layer formed on the dummy gate pads;
   a data wiring comprising a data line provided between the dummy gate pads;
   a data-insulating layer formed on the data wiring line;
   an organic layer formed on the data-insulating layer and having a contact hole exposing the data pad; and
   a contact subsidiary part covering the data pad exposed through the contact hole.

2. The thin film transistor substrate according to claim 1, wherein the gate-insulating layer and the data-insulating layer are a SiNx.

3. The thin film transistor substrate according to claim 1, wherein a thickness of the organic layer formed on the dummy gate pads is less than a thickness of the organic layer formed in a display area.

4. A method of making a thin film transistor substrate, comprising:
   forming a shorting bar in a pad area on an insulting substrate;
   forming a gate-insulating layer on the shorting bar;
   forming a data line crossing the shorting bar on the gate-insulating layer; and
   forming a data-insulating layer and an organic layer on the data line, wherein a thickness of the organic layer situated on the shorting bar is thicker than a thickness of the organic layer situated on a portion of the pad area except where the shorting bar is formed.

5. The method according to claim 4, further comprising:
   forming a contact hole to expose the shorting bar and the data line by etching the gate-insulating layer and the data-insulating layer using the organic layer as a mask; and
   forming a bridge part that connects the shorting bar to the data line by depositing and patterning a transparent conductive layer.

6. The method according to claim 4, further comprising removing a portion of the organic layer formed in a region where the shorting bar is formed by grinding the organic layer in the region where the shorting bar is formed.

7. The method according to claim 4, wherein the organic layer that is to be formed in a region where the shorting bar is formed is patterned by a mask having a slit, and the organic layer that is to be formed in a region of the pad area where the shorting bar is not formed is patterned by a mask that does not has a slit, when the organic layer is formed.

8. The method according to claim 5, wherein said forming the organic layer comprises:
   forming a bridge organic layer hole in a predetermined region of the shorting bar or the data line; and
   forming a slit pattern around the bridge organic layer hole, wherein said forming of the contact hole comprises etching the gate-insulating layer and the data-insulating layer by using the slit pattern formed around the bridge organic layer hole as a mask.

9. The method according to claim 8, wherein the slit pattern is formed to surround the bridge organic layer hole.

10. The method according to claim 8, further comprising removing a portion of the organic layer formed in a region where the shorting bar is formed by grinding the organic layer in the region where the shorting bar is formed.

11. The method according to claim 8, wherein the organic layer that is to be formed in a region where the shorting bar is formed is patterned by a mask having a slit, and the organic layer that is to be formed in a region of the pad area where the shorting bar is not formed is patterned by a mask that does not has a slit, when the organic layer is formed.

12. The method according to claim 10, wherein the organic layer that is to be formed in the region where the shorting bar is formed is patterned by a mask having a slit, and the organic layer that is to be formed in a region of the pad area where the shorting bar is not formed is patterned by a mask that does not has a slit, when the organic layer is formed.

13. The method according to claim 6, wherein the organic layer that is to be formed in a region where the shorting bar is formed is patterned by a mask having a slit, and the organic layer that is to be formed in a region of the pad area where the shorting bar is not formed is patterned by a mask that does not has a slit, when the organic layer is formed.

14. A method of making a thin film transistor substrate, comprising:
   forming a shorting bar in a pad area on an insulting substrate;
   forming a insulating layer on the shorting bar;
   forming a signal line crossing the shorting bar on the insulating layer;
   forming an organic layer on the signal line;
   forming a contact hole to expose the shorting bar and the signal line by etching the insulating layer and the data-insulating layer using the organic layer as a mask; and forming a bridge part that connects the shorting bar to the signal line by depositing and patterning a transparent conductive layer.

15. The method according to claim 14, wherein a thickness of the organic layer situated on the shorting bar is thicker than a thickness of the organic layer situated on a portion of the pad area except where the shorting bar is formed.

16. The method according to claim 14, wherein said forming the organic layer comprises:

forming a bridge organic layer hole in a predetermined region of the shorting bar; and forming a slit pattern surrounding the bridge organic layer hole.

17. The method according to claim 14, further comprising removing a portion of the organic layer formed in a region where the shorting bar is formed by grinding the organic layer in the region where the shorting bar is formed.

18. The method according to claim 14, wherein the organic layer that is to be formed in a region where the shorting bar is formed is patterned by a mask having a slit, and the organic layer that is to be formed in a region of the pad area where the shorting bar is not formed is patterned by a mask that does not has a slit, when the organic layer is formed.

19. The method according to claim 16, wherein said forming the contact hole comprises etching the insulating layer by using the slit pattern as a mask.

20. The method according to claim 17, wherein the organic layer that is to be formed in the region where the shorting bar is formed is patterned by a mask having a slit, and the organic layer that is to be formed in a region of the pad area where the shorting bar is not formed is patterned by a mask that does not has a slit, when the organic layer is formed.

* * * * *